SEMICONDUCTOR DIODE

Filed Nov. 22, 1960

INVENTOR
SHOICHI KITA

BY
Watson, Cole, Grindle & Watson
ATTORNEYS

United States Patent Office 3,012,174

Patented Dec. 5, 1961

3,012,174
SEMICONDUCTOR DIODE

Shoichi Kita, Tokyo, Japan, assignor to Nippon Telegraph and Telephone Public Corporation, Tokyo, Japan, a corporation of Japan Filed Nov. 22, 1960, Ser. No. 71,048
Claims priority, application Japan July 28, 1960
4 Claims. (Cl. 317—236)

This invention relates to a semiconductor or more particularly to a diode.

The diode according to the present invention is one in which is used an alloy wire made of silver and such trivalent element as gallium.

An object of the present invention is to provide a diode which is very low in the value of the barrier capacity.

Another object of the present invention is to provide a diode adapted to parameter amplifiers in microwaves.

Another object of the present invention is to easily obtain diodes of a very small junction area without needing any special technique.

In the accompanying drawings.

In a parameter amplifier wherein a signal to be amplified and an excitation power whose frequency is approximately twice as high as the signal frequency are added to a semiconductor diode so that the signal may be amplified by utilizing the nonlinearity of the barrier capacity of the diode, it is required that the value of Q of the semiconductor diode used therein should be high to carry out a high gain and low noise amplification.

Figure 1:
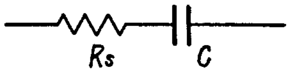
FIGURE 1 is a diagram showing the equivalent circuit of a diode.

The equivalent circuit of the diode is represented as in FIGURE 1 wherein $Rs$ is a series resistance and C is a barrier capacity. The value of Q in an angular frequency $\omega$ is represented by the Formula 1 by using $Rs$ and C:

$$Q=\frac{1}{\omega CRs} \qquad (1)$$

Further, the values of C and $Rs$ are represented by the Formulae 2 and 3:

$$C=\frac{\pi_a{}^2\epsilon^{1/2}}{\sqrt{2}b^{1/2}(P^{1/2}\phi-V)^{1/2}} \qquad (2)$$

$$Rs=\frac{P}{4_a} \qquad (3)$$

wherein $a$ is a radius of the contact part of the semiconductor with the needle of the diode, $\epsilon$ is a permittivity of the semi-conductor,
$b$ is a mobility of the carrier of the semiconductor,
P is a specific resistance of the semiconductor,
$\phi$ is a contact potential difference, and
V is a bias voltage.

In order to elevate the value of Q in the Formula 1, it is necessary to reduce the value of $CRs$. From the Formulae 2 and 3, the Formula 4 is derived:

$$CRs=\frac{\pi_a P^{1/2}\epsilon^{1/2}}{4\sqrt{2}b^{1/2}(\phi-V)^{1/2}} \qquad (4)$$

In order to increase the value of Q, it is necessary to make the radius $a$ of the contact part as small as possible.

Therefore, a gold bonded diode made by bringing a gold-gallium alloy wire into point contact with an N type germanium and applying electric forming thereto has been conventionally used as diode for parameter amplifiers on the ground that, with it, the contact radius can be made comparatively smaller. And yet it is difficult to make the contact radius smaller than $10\mu$. The value of C is about 1 pf. $Rs$ is about 5Ω. The value of Q thereof is about 5 at 10 kmc. and is not so high.

According to the present invention, a diode is made by using an alloy wire made of silver and such trivalent element as gallium instead of a gold-gallium wire in order to make the above-mentioned contact radius or C as small as possible.

Due to electric forming, a large electric current will momentarily flow through the contact part of the semiconductor with the needle, the contact part will be heated and the needle and germanium will melt to form a gold-germanium or silver-germanium alloy. In such case, the trivalent element such as gallium contained in the needle will act as a P type impurity and a P-N junction will be formed.

The melting point of the gold-germanium alloy is 350° C. and that of the silver-germanium alloy is 650° C. Thus the melting point of the gold-germanium alloy is lower. Therefore, if the electric forming is too large, as the gold-germanium alloy is easier to melt, its contact part will melt and the contact radius will be likely to become larger.

On the other hand, the melting point of the silver-germanium alloy is so high that the contact radius is little likely to become larger. Thus, in the diode in which is used a silver alloy wire according to the present invention, the value of C can be made smaller. Further, as such trivalent element as gallium contained in gold and silver will act as a P type impurity, it is desirable that the content of said element is high. However, whereas only about 5% gallium can be contained in gold, as much as about 10% gallium can be contained in silver. Therefore, even if the same germanium is used, when a needle containing more of the P type impurity is used, the P-N type junction will be easier to make and $Rs$ will be able to be made smaller.

In fact, in a diode in which was used a silver-gallium alloy wire according to the present invention, C was 0.1 pf., $Rs$ was about 5Ω and the value of Q was about 30 at 10 kmc.

In order to make the value of $CRs$ smaller, it is necessary, as understood from the Formula 4, to make the specific resistance P of the germanium lower. However, if it is too low, the inversed voltage will fall. In the diode according to the present invention, the best specific resistance was about 0.02 to 0.2 Ω-cm.

When such diode is to be manufactured, the surface of the semiconductor is etched to remove strains before electric forming is applied. In case a germanium of such low specific resistance as in the diode of the present invention is to be used, electric etching in which is used a solution of, for example, the following composition will be adapted:

| | | |
|---|---|---|
| Chromium sulphate | g | 15 |
| Water | cc | 50 |

Electric etching is carried out by using the germanium as an anode in such solution.

Figure 2:
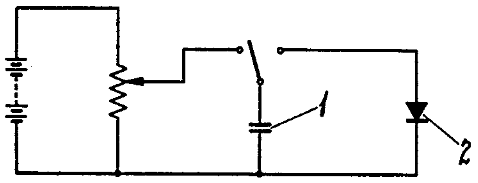
FIGURE 2 is a diagram showing an electric forming circuit adapted to the diode according to the present invention.

A needle is brought into point contact with such electrically etched germanium and electric forming is applied by using such circuit as is shown, for example, in FIGURE 2. That is to say, a condenser 1 is charged and its current is discharged through a diode 2 so as to be utilized to make electric forming. In such case, the manner of applying electric forming several times while raising the discharge voltage gradually from such low voltage as about 1 v. instead of raising it to a high voltage at once is adapted to the diode according to the present invention. In this manner, any optional and uniform characteristics can be easily obtained by watching the voltage-current characteristics of the diode.

Figure 3:
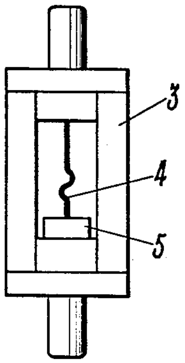
FIGURE 3 is a view showing an embodiment of a holder for the diode according to the present invention.

The diode according to the present invention can be conveniently used as inserted in such holder as is illustrated in FIGURE 3. In this holder, the outer periphery 3 is made of ceramics or glass, a germanium piece 5 is provided within it and a needle 4 is brought into point contact with the germanium. This holder is adapted to be used mainly at frequencies below 10 kmc.

Figure 4:
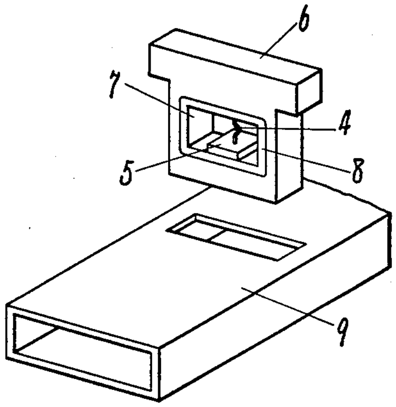
FIGURE 4 is a view showing another embodiment of a holder for the diode according to the present invention.

FIGURE 4 illustrates another embodiment of a holder for the diode of the present invention. A window 7 is made in the center of a metallic piece 6. The germanium piece 5 and the needle 4 are arranged within the metallic piece 6. Said window 7 are air-tightly covered on both sides with mica plates 8. The size of the window is of substantially the same dimensions as of the wave guide of the frequency band to be used. The holder is to be used as inserted in the wave guide 9.

By the above mentioned structure, the loss by the holder can be greatly reduced. This holder is adapted to be used especially at high frequencies above 10 kmc.

What is claimed:

1. A semiconductor diode made by etching the surface of an N type germanium of a specific resistance of 0.02 to 0.2 Ω-cm., then bringing an alloy wire containing silver and a trivalent element into point contact with the germanium and applying electric forming thereto.

2. A semiconductor diode according to claim 1 wherein the trivalent element is gallium.

3. A semiconductor diode according to claim 1 wherein the surface of an N type germanium of a specific resistance of 0.02 to 0.2 Ω-cm. is electrically etched with an aqueous solution of chromium sulphate.

4. A semiconductor diode according to claim 1 made by applying electric forming several times wherein a condenser is charged and its discharged current is utilized while the discharge voltage is being gradually raised from such low voltage as about 1 v.

References Cited in the file of this patent

UNITED STATES PATENTS

| | | |
|---|---|---|
| 2,583,009 | Olsen | Jan. 22, 1952 |
| 2,653,374 | Mathews et al. | Sept. 29, 1953 |
| 2,654,059 | Shockley | Sept. 29, 1953 |
| 2,680,220 | Starr et al. | June 1, 1954 |